United States Patent
Seo et al.

(10) Patent No.: US 9,472,740 B2
(45) Date of Patent: Oct. 18, 2016

(54) LIGHT EMITTING DIODE PACKAGE AND LIGHTING DEVICE USING THE SAME

(71) Applicant: SAMSUNG ELECTRONICS CO., LTD., Suwon-si, Gyeonggi-do (KR)

(72) Inventors: Jong Wan Seo, Ansan-si (KR); Kun Yoo Ko, Yongin-si (KR); Jae Hee Lee, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/612,049

(22) Filed: Feb. 2, 2015

(65) Prior Publication Data

US 2016/0027977 A1    Jan. 28, 2016

(30) Foreign Application Priority Data

Jul. 28, 2014    (KR) .................. 10-2014-0095950

(51) Int. Cl.
*H01L 29/49* (2006.01)
*H01L 33/60* (2010.01)
*H01L 33/62* (2010.01)

(52) U.S. Cl.
CPC .............. *H01L 33/60* (2013.01); *H01L 33/62* (2013.01)

(58) Field of Classification Search
CPC ............................. H01L 33/60; H01L 33/62
See application file for complete search history.

(56) References Cited

U.S. PATENT DOCUMENTS

| | | | |
|---|---|---|---|
| 6,245,448 B1 | 6/2001 | Abbott | |
| 6,372,608 B1 | 4/2002 | Shimoda et al. | |
| 6,455,102 B1 | 9/2002 | Kobayashi et al. | |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |

(Continued)

FOREIGN PATENT DOCUMENTS

| KR | 0017392 | * | 8/2007 |
|---|---|---|---|
| KR | 10-2010-0027582 A | | 3/2010 |

(Continued)

*Primary Examiner* — Michael Shingleton
(74) *Attorney, Agent, or Firm* — Lee & Morse, P.C.

(57) ABSTRACT

A light emitting diode (LED) package may include a package body provided with a pair of lead frames, and an LED chip mounted on the package body and electrically connected to the lead frames through wire bonding. Each lead frame may include a first reflective layer disposed on a mounting surface on which the LED chip is disposed and a second reflective layer disposed on the first reflective layer. A wire may penetrate through the second reflective layer to be connected to the first reflective layer. Accordingly, the LED package may provide the uniform amount of light by suppressing discoloration of the lead frames, and the manufacturing time of the LED package may be reduced, leading to a reduction in manufacturing costs.

20 Claims, 18 Drawing Sheets

(56) References Cited

U.S. PATENT DOCUMENTS

| | | |
|---|---|---|
| 7,759,140 B2 | 7/2010 | Lee et al. |
| 7,781,727 B2 | 8/2010 | Sherrer et al. |
| 7,790,482 B2 | 9/2010 | Han et al. |
| 7,875,533 B2 | 1/2011 | Epler et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,222,662 B2 | 7/2012 | Shen et al. |
| 8,263,987 B2 | 9/2012 | Choi et al. |
| 8,288,785 B2 | 10/2012 | Cho et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,981,401 B2* | 3/2015 | Yamada .............. H01L 33/60 257/666 |
| 2004/0229051 A1 | 11/2004 | Schaepkens et al. |
| 2011/0204398 A1 | 8/2011 | Tanida et al. |
| 2012/0199873 A1 | 8/2012 | Matsumura et al. |
| 2012/0228660 A1* | 9/2012 | Lee .................. H01L 33/60 257/98 |
| 2013/0020590 A1 | 1/2013 | Lin et al. |
| 2013/0193460 A1* | 8/2013 | Kanada ............... H01L 33/62 257/88 |
| 2013/0214298 A1 | 8/2013 | Lin et al. |
| 2013/0249375 A1 | 9/2013 | Panagotacos et al. |
| 2013/0341666 A1* | 12/2013 | Yoshida ............. H01L 24/97 257/98 |
| 2014/0217440 A1* | 8/2014 | Sung .................. H01L 33/60 257/98 |
| 2015/0179537 A1* | 6/2015 | Shioji ................ H01L 33/46 257/773 |
| 2015/0221831 A1* | 8/2015 | Kim ................... H01L 33/46 257/98 |
| 2015/0270450 A1* | 9/2015 | Kuroki ............... H01L 33/502 257/98 |
| 2015/0349227 A1* | 12/2015 | Oda ................... H01L 23/562 362/296.02 |

FOREIGN PATENT DOCUMENTS

| | | |
|---|---|---|
| KR | 10-2010-0106297 A | 10/2010 |
| KR | 10-2011-0095807 | 8/2011 |
| KR | 10-1104253 B1 | 1/2012 |
| KR | 10-1293993 B1 | 8/2013 |
| WO | 2010/104276 A2 | 9/2010 |

* cited by examiner

LIGHT EMITTING DIODE PACKAGE AND LIGHTING DEVICE USING THE SAME

CROSS-REFERENCE TO RELATED APPLICATION

This application claims the priority to Korean Patent Application No. 10-2014-0095950 filed on Jul. 28, 2014, with the Korean Intellectual Property Office, the disclosure of which is incorporated herein by reference.

TECHNICAL FIELD

The present disclosure relates to a light emitting diode (LED) package and a lighting device using the same.

BACKGROUND

A light emitting diode (LED) is a device including a material that emits light through the application of electrical energy thereto, in which energy generated by electron-hole recombination at semiconductor junctions is converted into light to be emitted therefrom. LEDs are commonly employed as light sources in general lighting devices, display devices, and the like, and the development of LEDs has thus been accelerated.

In particular, recently, the development and employment of LEDs (e.g., gallium nitride-based LEDs) has increased, and mobile device keypads, vehicle turn signal lamps, camera flashes, and the like, using such LEDs, have been commercialized, and in line with this, the development of general lighting devices using LEDs has been accelerated. Products in which LEDs are used, such as backlight units of large TVs, vehicle headlamps, general lighting devices, and the like, are gradually moving toward large-sized products having high outputs and high efficiency, and the range of LED use is being further expanded.

Accordingly, there is a need for a method of reducing manufacturing costs by shortening manufacturing time for mass production of LED packages, as well as a method of improving light output.

SUMMARY

An exemplary embodiment in the present disclosure may provide a light emitting diode (LED) package providing the uniform amount of light by suppressing discoloration of a lead frame.

An exemplary embodiment in the present disclosure may also provide a lighting device using the aforementioned LED package.

According to an exemplary embodiment in the present disclosure, a light emitting diode (LED) package may include a package body provided with a pair of lead frames and an LED chip mounted on the package body and electrically connected to the lead frames through wire bonding. Each lead frame may include a first reflective layer disposed on a mounting surface on which the LED chip is disposed and a second reflective layer disposed on the first reflective layer. A wire may penetrate through the second reflective layer to be connected to the first reflective layer.

The second reflective layer may have an opening formed by the wire, and the wire may contact an inner sidewall of the opening.

A region of the first reflective layer connected to the wire may be recessed.

The second reflective layer may include a first refractive layer and a second refractive layer.

The first refractive layer may be interposed between the second refractive layer and the first reflective layer.

The first refractive layer and the second refractive layer may include a light transmissive material.

The first refractive layer and the second refractive layer may form a distributed Bragg reflector (DBR).

The second reflective layer may have a thickness of 20 nm to 100 nm.

The second reflective layer may be disposed to cover the entirety of the first reflective layer.

The second reflective layer may be extended to side surfaces of the lead frame.

The second reflective layer may be disposed to cover the LED chip.

The second reflective layer may include a first refractive layer and a second refractive layer, and the second refractive layer and the first refractive layer may be sequentially stacked on the LED chip.

The second reflective layer may have a light transmissivity of 90% or higher.

The first reflective layer may be formed of a material having a refractive index of 1.2 to 1.7.

The second reflective layer may be formed of a material having a refractive index of 2.0 or higher.

The second reflective layer may be disposed to cover the entirety of the lead frame.

According to an exemplary embodiment in the present disclosure, a light emitting diode (LED) package may include a package body having a pair of lead frames and a concave portion through which the lead frames are exposed and an LED chip mounted on the lead frames within the concave portion and electrically connected to the lead frames through wire bonding. Each lead frame may include a first reflective layer disposed on a mounting surface on which the LED chip is disposed and a second reflective layer disposed on the first reflective layer. A wire may penetrate through the second reflective layer to be connected to the first reflective layer.

The second reflective layer may have an opening formed by the wire, and the wire may contact an inner sidewall of the opening.

The second reflective layer may be extended to a side surface of the concave portion.

According to an exemplary embodiment in the present disclosure, a lighting device may include: a fixed structure; and the aforementioned LED package coupled to the fixed structure and emitting light when power is supplied thereto through the fixed structure.

BRIEF DESCRIPTION OF THE DRAWINGS

The above and other aspects, features and advantages in the present disclosure will be more clearly understood from the following detailed description taken in conjunction with the accompanying drawings, in which.

DETAILED DESCRIPTION

Figure 1:
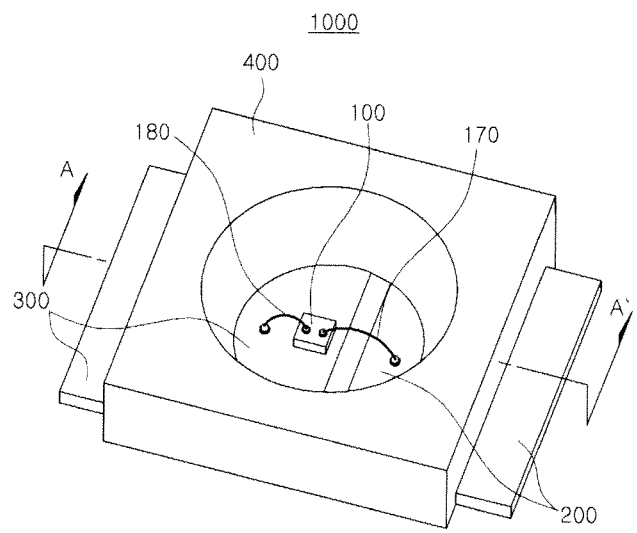
FIG. 1 is a perspective view schematically illustrating a light emitting diode (LED) package according to an exemplary embodiment in the present disclosure.

Exemplary embodiments in the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

In the present specification, terms such as "top," "top surface," "bottom," "bottom surface," "side (or lateral) surface," and the like, are determined based on the drawings, and in actuality, the terms may be changed according to a direction in which a device or a package is disposed.

Hereinafter, a light emitting diode (LED) package 1000 according to an exemplary embodiment in the present disclosure will be described.

Figure 2:
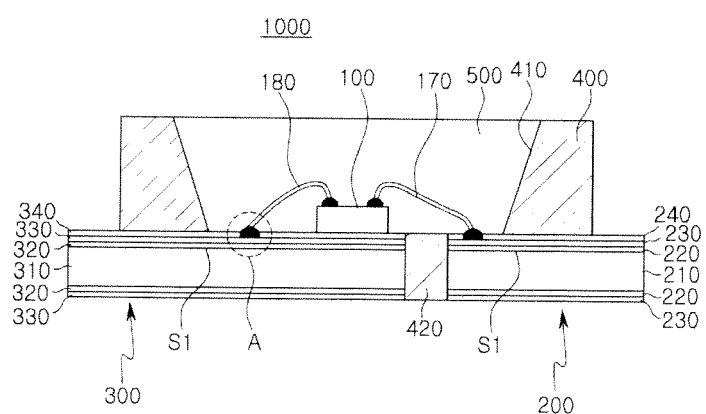
FIG. 2 is a cross-sectional view of the LED package of FIG. 1, taken along line A-A'.
Figure 3A:
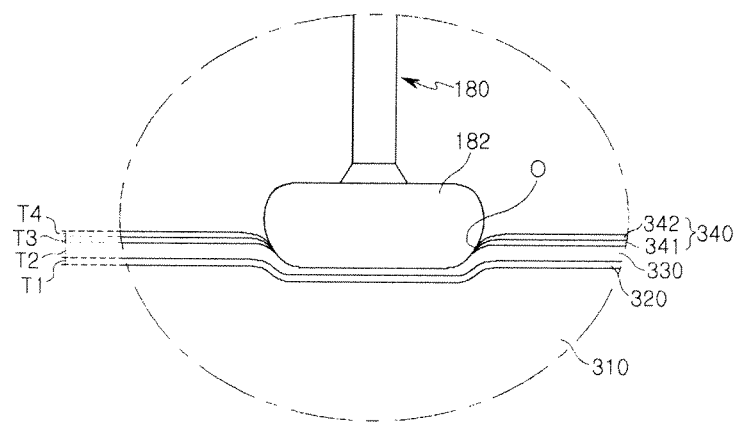
FIG. 3A is an enlarged view of portion A of FIG. 2.
Figure 3B:
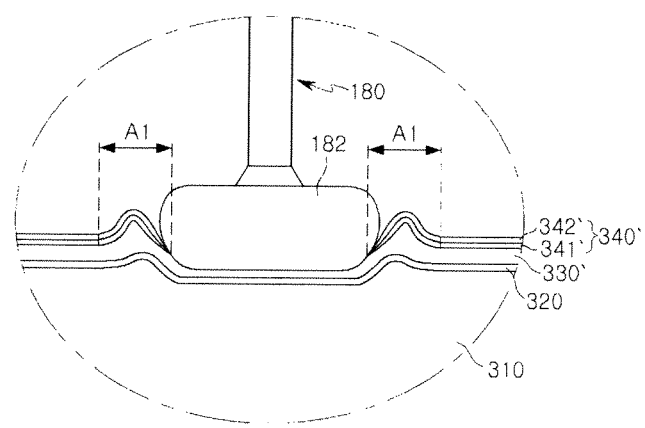
FIG. 3B is a modified example of FIG. 3A.

FIG. 1 is a perspective view schematically illustrating an LED package 1000 according to an exemplary embodiment in the present disclosure; FIG. 2 is a cross-sectional view of the LED package 1000 of FIG. 1, taken along line A-A'; FIG. 3A is an enlarged view of portion A of FIG. 2; and FIG. 3B is a modified example of FIG. 3A.

With reference to FIGS. 1 and 2, the LED package 1000 may include a package body 400 having lead frames 200 and 300 and an LED chip 100.

The package body 400 may have the first and second lead frames 200 and 300, and the LED chip 100 may be mounted on a region of the second lead frame 300. The package body 400 may be formed by molding regions of the first and second lead frames 200 and 300 with an insulating resin. The region of the package body 400, in which the LED chip 100 is mounted, may have a concave surface which is formed as an inclined surface 410 in a direction toward the LED chip 100.

The LED chip 100 may be mounted on one surface of the lead frame 300, and any photoelectric device emitting light when electrical signals are applied thereto may be used as the LED chip 100. A semiconductor LED chip formed by epitaxially grown semiconductor layers on a semiconductor growth substrate may be a representative device that may be used as the LED chip 100.

Figure 7:
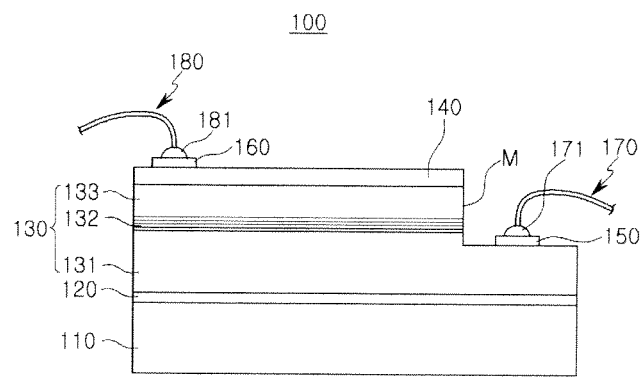
FIG. 7 is a view illustrating an LED chip used in the LED package of FIG. 1.

As illustrated in FIG. 7, the LED chip 100 may include a substrate 110 and a light emitting structure 130 grown on the substrate 110. The light emitting structure 130 may include a first conductivity-type semiconductor layer 131, an active layer 132 and a second conductivity-type semiconductor layer 133 sequentially disposed on the substrate 110.

The substrate 110 may be provided as a substrate for semiconductor growth, and may be formed of an insulating, conductive or semiconductor material, such as sapphire, SiC, $MgAl_2O_4$, MgO, $LiAlO_2$, $LiGaO_2$, GaN, or Si. In a case of a substrate formed of sapphire, a crystal having electrical insulating properties and Hexa-Rhombo R3C symmetry, the sapphire substrate commonly used as a nitride semiconductor growth substrate has a lattice constant of 13.001 Å along a C-axis and a lattice constant of 4.758 Å along an A-axis and includes a C(0001) plane, an A(11-20) plane, an R(1-102) plane, and the like. Here, the C plane is mainly used as a substrate for nitride semiconductor growth because it facilitates the growth of a nitride film and is stable at high temperatures. Although not shown, a plurality of uneven portions may be formed on a top surface of the substrate 110, namely, a growth surface for semiconductor layers, and may improve crystallinity, light emitting efficiency, and the like of the semiconductor layers.

A buffer layer 120 may be provided to address lattice mismatch between the substrate 110 and the first conductivity type semiconductor base layer 131 grown on the substrate 110, and may be an un-doped semiconductor layer formed of nitride or the like. The buffer layer 120 may be formed of an undoped GaN layer, an undoped AlN layer, an undoped InGaN layer, or the like, and may be grown to have a thickness of tens of to hundreds of Å at relatively low temperatures ranging from 500° C. to 600° C. Here, the "undoped" semiconductor layer refers to a semiconductor layer which is not doped with any dopant, but a dopant naturally present in the semiconductor layer is included at a predetermined concentration. For example, in a case in which a GaN semiconductor layer is grown by metal organic chemical vapor deposition (MOCVD), the concentration of Si or the like, used as a dopant, may be inevitably provided within a range of approximately $10^{14}$/M to $10^{18}$/M. However, the buffer layer 120 is not an essential element, and may be omitted according to exemplary embodiments.

The light emitting structure 130 may include the first conductivity-type semiconductor layer 131, the active layer 132 and the second conductivity-type semiconductor layer 133 sequentially disposed therein. The first and second conductivity-type semiconductor layers 131 and 133 may be n-type and p-type semiconductor layers, respectively, and may be formed of nitride semiconductors. In the present exemplary embodiment, the first and second conductivity-type semiconductor layers 131 and 133 are referred to as n-type and p-type semiconductor layers, respectively, but are not limited thereto. The first and second conductivity-type semiconductor layers 131 and 133 may have a composition of $Al_xIn_yGa_{(1-x-y)}N$ (where $0 \le x < 1$, $0 \le y < 1$, and $0 \le x+y < 1$). For example, semiconductor materials, such as GaN, AlGaN, and InGaN, may be used.

The active layer 132 may emit visible light having a predetermined wavelength range of 350 nm to 680 nm, and may be formed of undoped nitride semiconductor layers having a single-quantum well (SQW) structure or a multi-quantum well (MQW) structure. For example, the active layer 132 may have an MQW structure in which quantum well layers and quantum barrier layers are alternately stacked to have a predetermined energy bandgap, wherein the layers may have a composition of $Al_xIn_yGa_{(1-x-y)}N$ (where $0 \le x < 1$, $0 \le y < 1$, and $0 \le x+y < 1$). Electrons and holes may be recombined in the MQW structure, thereby emitting light. For example, an InGaN/GaN structure may be used as the MQW structure. The first and second conductivity-type semiconductor layers 131 and 133 and the active layer 132 may be formed by using a crystal growth process such as metal organic chemical vapor deposition (MOCVD), molecular beam epitaxy (MBE), and hydride vapor phase epitaxy (HVPE).

A transparent electrode layer 140 may be formed on the second conductivity-type semiconductor layer 133. The transparent electrode layer 140 may be provided as a current diffusion layer, and may be disposed on a top surface of the second conductivity-type semiconductor layer 133. The transparent electrode layer 140 may be formed of a transparent conductive oxide selected from the group consisting of indium tin oxide (ITO), zinc-doped indium tin oxide (ZITO), zinc indium oxide (ZIO), gallium indium oxide (GI), zinc tin oxide (ZTO), fluorine-doped tin oxide (FTO), aluminum-doped zinc oxide (AZO) gallium-doped zinc oxide (GZO), $In_4Sn_3O_{12}$ and zinc magnesium oxide ($Zn_{(1-x)}Mg_xO$ where $0 \le x \le 1$).

First and second electrodes 150 and 160 may be provided to apply external power to the first and second conductivity-type semiconductor layers 131 and 133, and may be disposed to be in ohmic contact with the first and second conductivity-type semiconductor layers 131 and 133, respectively. The first and second electrodes 150 and 160 may have a single-layer or multilayer structure formed of a conductive material having ohmic contact characteristics with respect to the first and second conductivity-type semiconductor layers 131 and 133. For example, the first and second electrodes 150 and 160 may be formed by depositing or sputtering at least one of Au, Ag, Cu, Zn, Al, In, Ti, Si, Ge, Sn, Mg, Ta, Cr, W, Ru, Rh, Ir, Ni, Pd, Pt, a transparent conductive oxide (TCO), and the like. The first electrode 150 may be disposed on a mesa surface M obtained by etching portions of the second conductivity-type semiconductor layer 133, the active layer 132, and the first conductivity-type semiconductor layer 131.

The first and second electrodes 150 and 160 may be electrically connected to the first and second lead frames 200 and 300 using wires 170 and 180, respectively. Here, bumps 171 and 181 may be formed on the first and second electrodes 150 and 160, respectively.

The first lead frame 200 and the second lead frame 300 may be formed using base substrates 210 and 310, and may have a mounting region on which the LED chip 100 is mounted. In the present exemplary embodiment, the LED chip 100 is mounted on the second lead frame 300 by way of example, but the present disclosure is not limited thereto.

The mounting region of the lead frame 300 on which the LED chip 100 is mounted may have a flat top surface to allow the LED chip 100 to be easily seated thereon and electrically connected thereto. By molding the regions S1 of the first and second lead frames 200 and 300 with an insulating resin, the package body 400 may be formed to have the inclined surface 410, and an electrode separation region 420 may be formed between the first and second lead frames 200 and 300.

The base substrates 210 and 310 may be formed of a metal having superior electrical conductivity such as copper (Cu), a Cu alloy, or a phosphor-bronze alloy, but are not limited thereto. Metal layers 220 and 320 may be further formed on the base substrates 210 and 310 to prevent electromigration. The metal layers 220 and 320 may include nickel (Ni) or a Ni alloy, and may be formed to have a thickness of 3 μm or less on surfaces of the base substrates 210 and 310. More specifically, the metal layers 220 and 320 may be formed to have a thickness T1 of 0.3 μm or less on the surfaces of the base substrates 210 and 310.

First reflective layers 230 and 330 may be formed on one or more surfaces of the base substrates 210 and 310. The first reflective layers 230 and 330 may be provided to improve reflectivity of the first and second lead frames 200 and 300 to thereby enhance external light extraction efficiency of the LED package 1000, and may be formed of a material having high light reflectivity. For example, silver (Ag) having superior light reflectivity and electrical conductivity may be used. In a case in which the first reflective layers 230 and 330 are formed of Ag, the first reflective layers 230 and 330 may be formed to have a thickness T2 of 200 μm to 300 μm. However, during the manufacturing process of the LED package 1000, Ag may be combined with sulfur (S) which is a trace element present in the air, thereby forming silver sulfide ($Ag_2S$), a black crystal. Such silver sulfide having black color may cause discoloration of the surfaces of the first and second lead frames 200 and 300, resulting in reduced surface reflectivity of the lead frames. Accordingly, external light extraction efficiency of the LED package 1000 may be reduced.

According to an exemplary embodiment, in order to alleviate a reduction in surface reflectivity of the lead frames, second reflective layers 240 and 340 may be formed on the first reflective layers 230 and 330. The second reflective layers 240 and 340 may serve as protective layers preventing the first reflective layers 230 and 330 from contacting moisture and oxygen. In addition, the second reflective layers 240 and 340 may be formed of a high reflectivity material to serve as reflective layers.

The second reflective layer 340 of the second lead frame 300 will be detailed with reference to FIGS. 3A and 3B. The second reflective layer 240 of the first lead frame 200 also has the same configuration as that of the second reflective layer 340.

The second reflective layer 340 may be disposed to cover the entirety of the first reflective layer 330. In a case in which the first reflective layer 330 is formed on one region of the lead frame 300, the second reflective layer 340 may only be disposed on one region of the lead frame 300 to cover the first reflective layer 330 disposed on one region. Alternatively, the second reflective layer 340 may be formed to cover the entire surface of the lead frame.

The second reflective layer 340 may have a single layer structure or a multilayer structure. In a case in which the second reflective layer 340 has a single layer structure, the single layer may be formed of a material including $Al_2O_3$, $SiO_2$, $TiO_2$ or $Nb_2O_3$. Such a material has a high light transmissivity of 90% or above and low permeability of oxygen and moisture, whereby it may transmit light reflected by the first reflective layer 330 disposed therebelow to allow the light to be emitted externally, and may prevent the first reflective layer 330 from contacting oxygen and moisture to thereby avoid discoloration of the lead frame.

The second reflective layer 340 may be formed to have a thickness of 20 nm to 100 nm. In a case in which the thickness of the second reflective layer 340 is less than 20 nm, the permeability of oxygen and moisture may be significantly increased, the effect of preventing permeation of oxygen and moisture may be reduced. In a case in which the thickness of the second reflective layer 340 is greater than 100 nm, the wire may fail to penetrate therethrough. Details thereof will be provided below.

In a case in which the second reflective layer 340 has a multilayer structure, it may be formed as a structure in which a first refractive layer 341 and a second refractive layer 342 are sequentially stacked. Here, the first refractive layer 341 may be disposed to contact the first reflective layer 330, and the second refractive layer 342 may be disposed on the top of the first refractive layer 341. The first refractive layer 341 and the second refractive layer 342 may be stacked on the first reflective layer 330 once. However, the configuration thereof is not limited thereto, and the first refractive layer 341 and the second refractive layer 342 may be alternately stacked on the first reflective layer 330 at least twice.

FIG. 3A illustrates a case in which the first refractive layer 341 and the second refractive layer 342 are stacked once. The first refractive layer 341 may include $Al_2O_3$ or $SiO_2$. Since the material, such as $Al_2O_3$ or $SiO_2$, has the excellent effect of preventing the permeation of oxygen and moisture, the first refractive layer 341 may effectively prevent the first reflective layer 330 disposed therebelow from contacting oxygen and moisture.

In addition, the second refractive layer 342 may include $TiO_2$ or $Nb_2O_3$. Since the material, such as $TiO_2$ or $Nb_2O_3$, has high light reflectivity, the second refractive layer 342 may effectively reflect external light to thereby further improve the external light extraction efficiency of the LED package 1000. The sum of a thickness T3 of the first refractive layer 341 and a thickness T4 of the second refractive layer 342 may be within a range of 20 nm to 100 nm, as in a case in which the second reflective layer 340 is formed to have a single layer structure.

In addition, by appropriately adjusting the refractivity and thickness of the first refractive layer 341 and the second refractive layer 342 forming the multilayer structure, a distributed Bragg reflector (DBR) may be provided.

As illustrated in FIG. 3A, such a DBR may be formed by stacking the first refractive layer 341 and the second refractive layer 342 having different refractive indices. The first and second refractive layers 341 and 342 forming the DBR may be formed of a light transmissive material having a high light transmissivity of 90% or above. Since such a DBR is disposed on a top surface of the second lead frame 300 on which the LED chip 100 is seated, when light emitted from the LED chip 100 is reflected by an interface of a wavelength conversion part 500 sealing the LED chip 100 to thereby move toward the lead frame 300, the second reflective layer 340 of the DBR may reflect the light with high reflectivity. Therefore, the external light extraction efficiency of the LED package 1000 may be further improved.

Figure 22A:
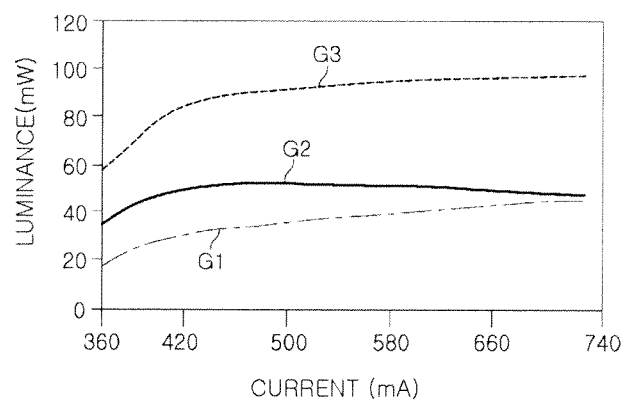
FIG. 22A illustrates reflectivity measurement results in a case in which a second reflective layer is not formed.
Figure 22B:
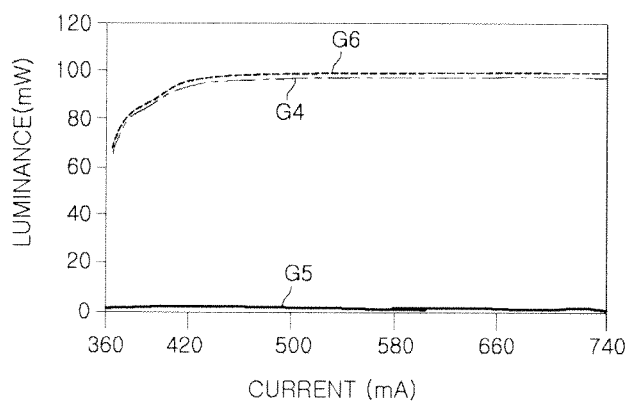
FIG. 22B illustrates reflectivity measurement results in a case in which a second reflective layer is formed.

FIG. 22A illustrates reflectivity measurement results in a case in which the second reflective layer is not formed, while FIG. 22B illustrates reflectivity measurement results in a case in which the second reflective layer is formed. Compared with specular reflectivity (G1), diffuse reflectivity (G2) and total reflectivity (G3) illustrated in FIG. 22A, it can be seen in FIG. 22B that specular reflectivity (G4) is significantly improved and total reflectivity (G6) is increased throughout the entire region, while diffuse reflectivity (G5) is significantly reduced. Therefore, in a case in which the second reflective layer is formed, reflectivity may be significantly improved.

The second reflective layer 340 may include the first refractive layer 341 and the second refractive layer 342 having different refractive indices, and the refractive index of the second refractive layer 342 may be higher than that of the first refractive layer 341.

Specifically, the first refractive layer 341 may include one of $SiO_2$ (refractive index: approximately 1.46) or $Al_2O_3$ (refractive index: approximately 1.68), and the second refractive layer 342 may include one of $TiO_2$ (refractive index: approximately 2.3) or $Nb_2O_3$ (refractive index: approximately 2.4).

Meanwhile, the second reflective layer 340 may be formed to have high reflectivity with respect to a particular wavelength range. That is, the second reflective layer 340 may be formed to effectively reflect light of a wavelength range corresponding to the wavelength of light converted by phosphors included in the wavelength conversion part 500 of the LED package 1000. To this end, the thicknesses and refractive indices of the first and second refractive layers 341 and 342 forming the second reflective layer 340 may be adjusted.

In addition, in order to electrically connect the LED chip 100 to the lead frame 300, a portion of the second reflective layer 340 may be removed to form an opening O. The opening O may be formed by allowing the wire 180 to penetrate through the second reflective layer 340 during wire bonding, not by using a separate etching process. Details thereof will be provided below.

Figure 21A:
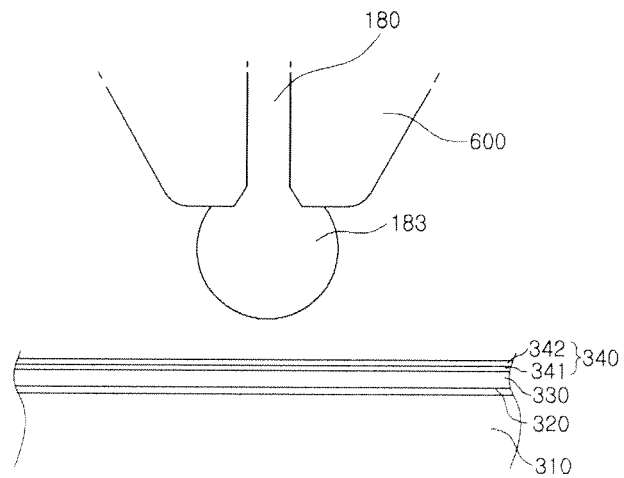
FIGS. 21A and 21B are views schematically illustrating a wire bonding method of FIG. 1.
Figure 21B:
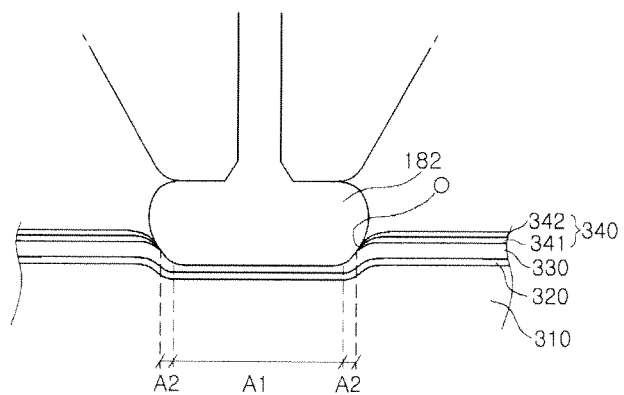

With reference to FIGS. 21A and 21B, details of the wire 180 penetrating through the second reflective layer 340 during wire bonding will be provided. FIGS. 21A and 21B are views schematically illustrating a process of bonding the wire 180 of FIG. 1.

As illustrated in FIG. 21A, in order to bond the wire 180 to the lead frame, the wire 180 exposed through an end of a capillary 600 may be heated to form a ball pad 183.

Next, as illustrated in FIG. 21B, the ball pad 183 may be bonded to a desired position, and ultrasonic waves and pressure may be applied thereto. Through this process, a bump 182 may be formed on the lead frame, and in particular, the first reflective layer 330 and the wire 180 may be metal-bonded to each other. Here, a portion of the second reflective layer 340 may be evaporated due to heat generated during the forming of the bump, and the opening O may be formed. Since an inner sidewall of the opening O contacts the bump 182 of the wire 180, no space is formed between the opening and the bump 182. Therefore, the removal of a space that may be formed in a case in which wire bonding is performed after an opening to which a wire is to be bonded is formed in one region of the second reflective layer 340 may prevent oxygen and moisture from permeating into the first reflective layer through the opening O. Therefore, the discoloration of the first reflective layer 330 may be avoided.

The sidewall of the opening O formed in the second reflective layer 340 may be formed to have a downwardly inclined surface as illustrated in FIG. 3A, or a protruded portion Al may be formed on regions of first and second reflective layers 330' and 340' in contact with a side surface of the bump 182, due to the pressure during the wire bonding process, as illustrated in FIG. 3B. In this case, first and second refractive layers 341' and 342' of the second reflective layer 340' may also have the protruded portion Al. In some cases, the second reflective layer 340' may be formed to have an upwardly inclined surface.

However, in a case in which the thickness T3+T4 of the second reflective layer 340 is excessively thick, the second reflective layer 340 may remain below the bump 182 after wire bonding. Since the second reflective layer 340 is formed of a material having high light reflectivity while having a relatively lower electrical conductivity than a general conductive material, the amount of current supplied to the lead frames 200 and 300 may be reduced when a predetermined electric potential is applied to the lead frames 200 and 300, whereby the internal light extraction efficiency of the LED chip 100 may be reduced.

Therefore, the thickness of the second reflective layer 340 may be determined to allow for the formation of the opening O during wire bonding so as not to be remained. As a measurement result, when the thickness of the second reflective layer 340 exceeded approximately 100 nm, the second reflective layer 340 was remained. Therefore, the thickness of the second reflective layer 340 may be determined to not exceed approximately 100 nm.

The wavelength conversion part 500 may be formed on the concave surface of the package body 400. The wavelength conversion part 500 may be formed to seal the LED chip 100. The wavelength conversion part 500 may include a phosphor or a quantum dot capable of converting the wavelength of light emitted from the LED chip 100 into a particular wavelength. Here, the phosphor or quantum dot may be combined with a dispersant formed of a transparent liquid resin. The dispersant may be selected from the group consisting of a silicone-based resin, an epoxy-based resin, an acryl-based resin, a poly methyl methacrylate (PMMA) resin, mixtures thereof and compounds thereof. The phosphor may convert the wavelength of light emitted from the LED chip 100 into one of yellow, red and green light wavelengths, and types of the phosphor may be determined according to the wavelength of light emitted from the LED chip 100. Specifically, the phosphor may include any one of YAG-based, TAG-based, silicate-based, sulfide-based, nitride-based fluorescent materials. For example, when a phosphor converting a wavelength of light into yellow light is applied to a blue light emitting LED chip, white light may be obtained.

In the LED package 1000 having the above-described configuration, when the light emitted from the LED chip 100 is reflected by the interface of the wavelength conversion part 500 sealing the LED chip 100 to thereby move toward the lead frames 200 and 300, it may be reflected by the first reflective layers 230 and 330 and the second reflective layers 240 and 340 with high reflectivity, whereby external light extraction efficiency may be further improved.

Moreover, since the first reflective layers 230 and 330 that may easily be discolored by moisture and oxygen are covered with the second reflective layers 240 and 340 preventing the permeation of moisture and oxygen, the reflectivity of the first reflective layers 230 and 330 may be stably maintained.

In addition, the openings of the second reflective layers 240 and 340 to which moisture and oxygen may easily be permeated and the wires 170 and 180 may contact each other without spaces therebetween. Therefore, the discoloration of the first reflective layers 230 and 330 that may be caused by the permeation of moisture and oxygen through the spaces may be avoided.

Figure 4:
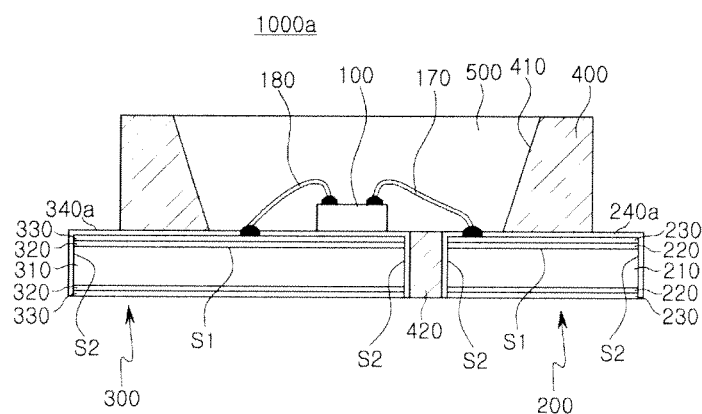
FIG. 4 is a cross-sectional view illustrating an LED package according to a first modified embodiment in the present disclosure.

With reference to FIG. 4, an LED package according to a first modified embodiment in the present disclosure will be described. An LED package 1000a according to the first modified embodiment differs from the LED package according to the preceding exemplary embodiment in that second reflective layers 240a and 340a may be extended to side surfaces S2 of the lead frames 200 and 300. In the case in which the second reflective layers 240a and 340a are extended to the side surfaces S2 of the lead frames 200 and 300, they may prevent the first reflective layers 230 and 330 from contacting moisture and oxygen through the side surfaces S2 of the lead frames 200 and 300, whereby the discoloration of the first reflective layers 230 and 330 may be effectively prevented.

Figure 5:
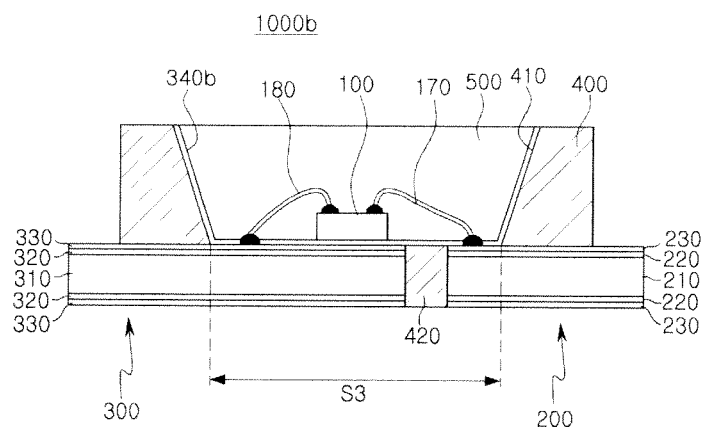
FIG. 5 is a cross-sectional view illustrating an LED package according to a second modified embodiment in the present disclosure.

With reference to FIG. 5, an LED package according to a second modified embodiment in the present disclosure will be described. An LED package 1000b according to the second modified embodiment differs from the LED package according to the preceding exemplary embodiment in that a second reflective layer 340b may be extended to the inclined surface 410 of the package body 400. In a case in which the second reflective layer 340b is formed on the inclined surface 410 of the package body 400, the light reflectivity of the inclined surface 410 may be further improved. In addition, since the second reflective layer 340b is formed on the first and second lead frames 200 and 300 and the inclined surface 410 in a single process, the manufacturing process may be further simplified.

In addition, the second reflective layer 340b may only be formed on regions S3 of the lead frames 200 and 300 exposed below a bottom surface of the package body 400, but may not be formed on contact regions between the package body 400 and the first and second lead frames 200 and 300. Therefore, adhesion between the lead frames 200 and 300 and the package body 400 may be improved, and the permeation of oxygen and moisture between the lead frames 200 and 300 and the package body 400 may be effectively prevented. Thus, the reliability of the LED package 1000b may be further improved.

Figure 6:
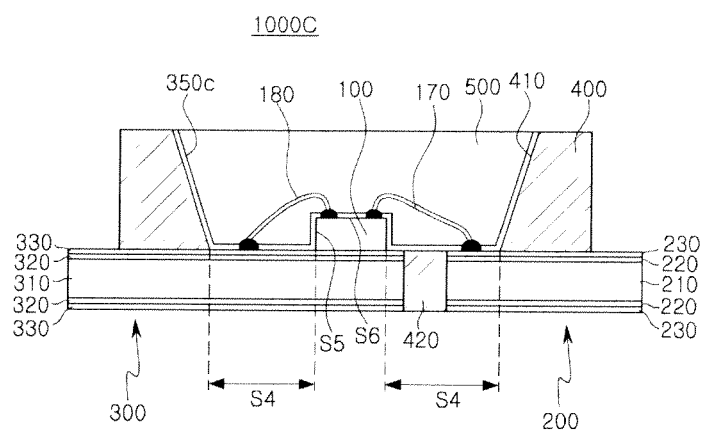
FIG. 6 is a cross-sectional view illustrating an LED package according to a third modified embodiment in the present disclosure.

With reference to FIG. 6, an LED package according to a third modified embodiment in the present disclosure will be described. An LED package 1000c according to the third modified embodiment differs from the LED package according to the second modified embodiment in that a second reflective layer 350c is extended to a surface S5 and S6 of the LED chip 100.

In a case in which the second reflective layer 350c is formed on the LED chip 100, light reflectivity may be increased on the surface of the LED chip 100, external light extraction efficiency may be improved.

In a case in which the second reflective layer 350c is formed to have a multilayer structure, when the first refractive layer 341 is disposed to be stacked on the second refractive layer 342 unlike the preceding exemplary embodiment, the amount of light reflected to the interior of the LED chip 100 may be reduced, whereby external light extraction efficiency may be further improved.

Hereinafter, a method of manufacturing the LED package 1000 illustrated in FIG. 1 will be described. FIGS. 8 through 12 are views illustrating sequential processes in a method of manufacturing the LED package 1000 of FIG. 1.

Figure 8:
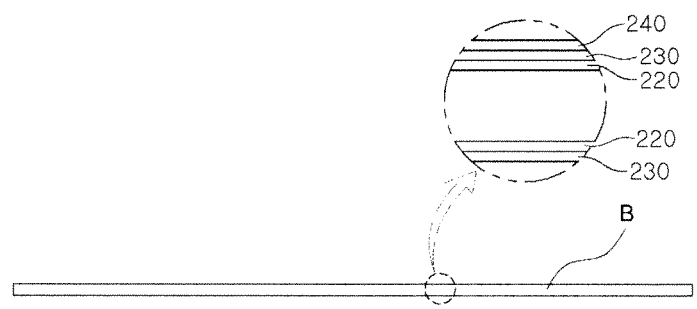
FIGS. 8 through 12 are views illustrating sequential processes in a method of manufacturing the LED package of FIG. 1.
Figure 9:
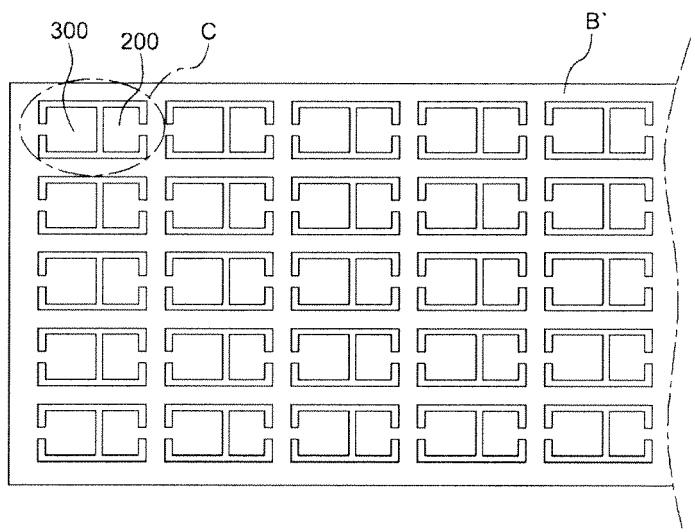

As illustrated in FIGS. 8 and 9, a substrate B formed of a base material may be prepared, and the metal layers 220 and 320, the first reflective layers 230 and 330 and the second reflective layers 240 and 340 may be sequentially stacked on a surface of the substrate B. The metal layers 220 and 320, the first reflective layers 230 and 330 and the second reflective layers 240 and 340 may be formed by a non-plating process such as vacuum deposition or sputtering. Among them, the metal layers 220 and 320 and the first reflective layers 230 and 330 may be formed by a plating process. The substrate B may be formed of copper (Cu), a Cu alloy, a phosphor-bronze alloy, or the like, having superior electrical conductivity.

Figure 10:
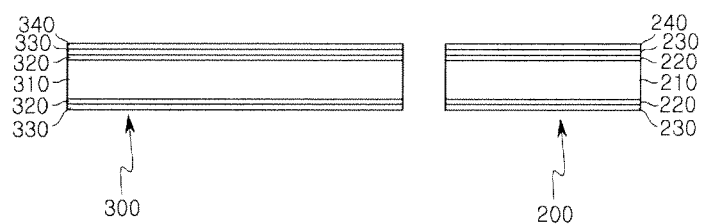

Next, the substrate B may be patterned to form a patterned substrate B'. The patterning method may include etching, stamping, punching or the like, but is not limited thereto. FIG. 9 is a plan view illustrating a plurality of lead frames simultaneously formed on the patterned substrate B', and FIG. 10 is a cross-sectional view of portion C of FIG. 9.

Figure 11:
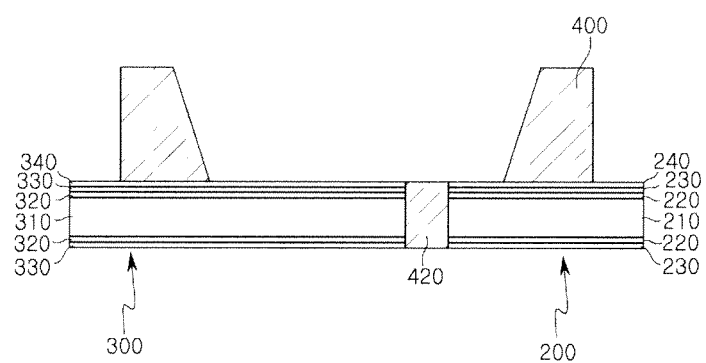

Thereafter, as illustrated in FIG. 11, the package body 400 may be formed by accommodating the patterned substrate B' in a mold, and injection-molding a resin. Alternatively, the package body 400 may be formed by accommodating the patterned substrate B' in a mold, and injecting a resin such as an epoxy molding compound (EMC) and curing the same at an appropriate high temperature.

Figure 12:
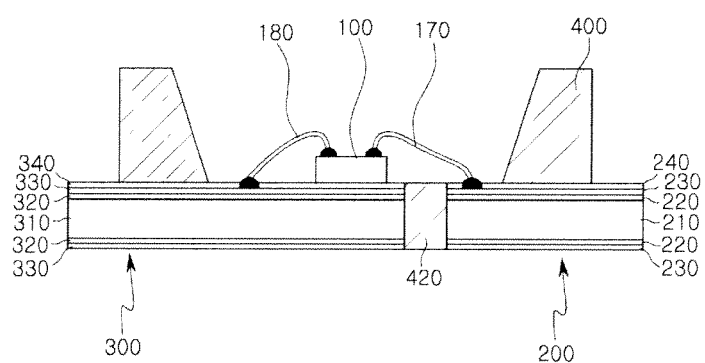

Then, as illustrated in FIG. 12, the LED chip 100 may be mounted on the second lead frame 300, and the first and second electrodes 150 and 160 of the LED chip 100 (see FIG. 7) may be wire-bonded to the surfaces of the first and second lead frames 200 and 300 using the wires 170 and 180, respectively.

As described above, when the wires 170 and 180 are bonded by applying ultrasonic waves and pressure thereto, the wires 170 and 180 may penetrate through the second reflective layers 240 and 340 to thereby be bonded to the first reflective layers 230 and 330. The wavelength conversion part 500 may be formed in a concave portion of the package body 400 so as to seal the LED chip 100. Specifically, the wavelength conversion part 500 may be formed by mixing a phosphor or a quantum dot with a dispersant formed of a transparent liquid resin and filling the mixture in the concave portion of the package body 400. Here, the dispersant may be selected from the group consisting of a silicone-based resin, an epoxy-based resin, an acryl-based resin, a poly methyl methacrylate (PMMA) resin, mixtures thereof and compounds thereof.

The LED packages 1000 formed through the above-mentioned processes may be individually separated from each other.

Figure 13:
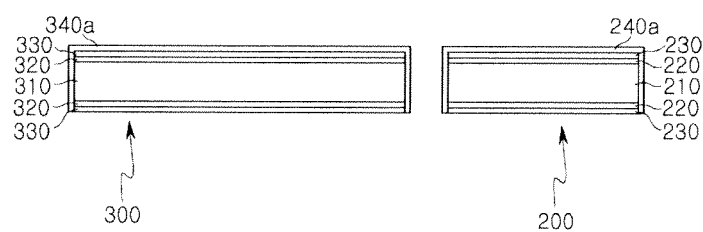
FIGS. 13 through 15 are views illustrating sequential processes in a method of manufacturing the LED package of FIG. 4.
Figure 14:
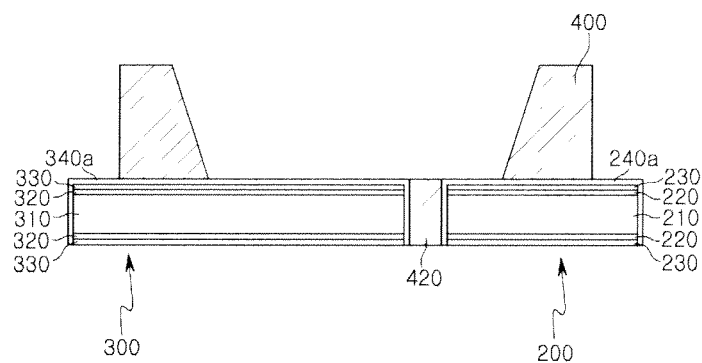
Figure 15:
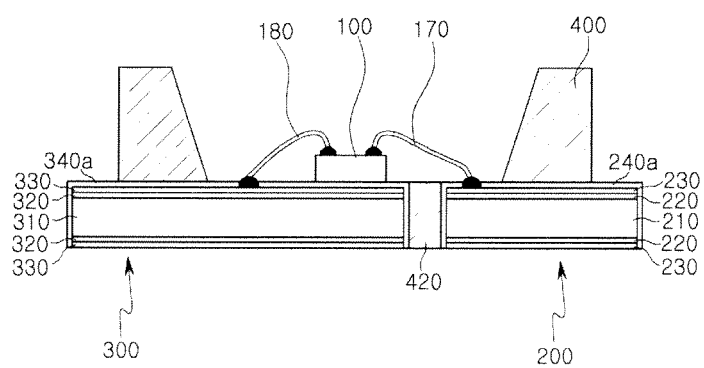

Hereinafter, a method of manufacturing the LED package 1000a illustrated in FIG. 4 will be described. FIGS. 13 through 15 are views illustrating sequential processes in a method of manufacturing the LED package 1000a of FIG. 4.

First of all, the substrate B formed of a base material may be prepared, and the metal layers 220 and 320 and the first reflective layers 230 and 330 may be sequentially stacked on a surface of the substrate B.

Next, the substrate B formed of the base material may be patterned to form the patterned substrate B' (see FIG. 9).

Next, as illustrated in FIG. 13, the second reflective layers 240a and 340a may be stacked on the patterned substrate B'. Here, the second reflective layers 240a and 340a may be extended to side surfaces of the patterned substrate B' as illustrated in FIG. 13.

Thereafter, as illustrated in FIG. 14, the package body 400 may be formed by accommodating the patterned substrate B' in a mold, and injection-molding a resin. Alternatively, the package body 400 may be formed by accommodating the patterned substrate B' in a mold, and injecting a resin such as an epoxy molding compound (EMC) into the mold and curing the same at an appropriate high temperature.

Then, as illustrated ion FIG. 15, the LED chip 100 may be mounted on the second lead frame 300, and the first and second electrodes 150 and 160 of the LED chip 100 (see FIG. 7) may be e-bonded to the surfaces of the first and second lead frames 200 and 300 using the wires 170 and 180, respectively. Subsequent processes may be performed in the same manner as in the manufacturing method according to the preceding exemplary embodiment.

Figure 16:
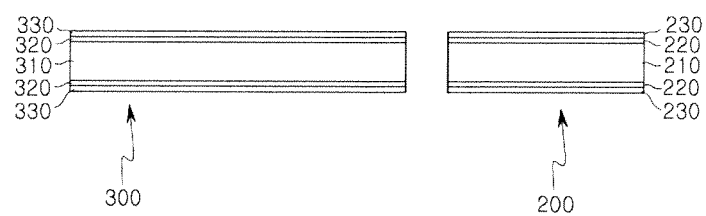
FIGS. 16 through 18 are views illustrating sequential processes in a method of manufacturing the LED package of FIG. 5.
Figure 17:
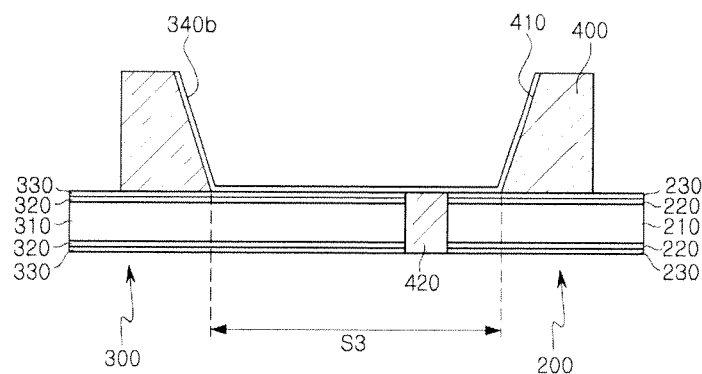
Figure 18:
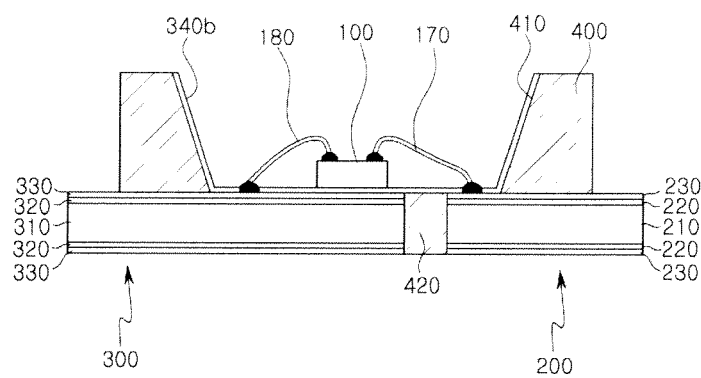

Hereinafter, a method of manufacturing the LED package 1000b illustrated in FIG. 5 will be described. FIGS. 16 through 18 are views illustrating sequential processes in a method of manufacturing the LED package 1000b of FIG. 5.

First of all, as illustrated in FIG. 16, the substrate B formed of a base material may be prepared, and the metal layers 220 and 320 and the first reflective layers 230 and 330 may be sequentially stacked on a surface of the substrate B.

Next, the substrate B formed of the base material may be patterned to form the patterned substrate B' (see FIG. 9).

Thereafter, as illustrated in FIG. 17, the package body 400 may be formed, and the second reflective layer 340b may be formed on the bottom surface S3 and the inclined surface 410 of the package body 400.

The package body 400 may be formed by accommodating the lead frames 200 and 300 in a mold, and injection-molding a resin. Alternatively, the package body 400 may be formed by accommodating the lead frames 200 and 300 in a mold, and injecting a resin such as an epoxy molding compound (EMC) and curing the same at an appropriate high temperature.

Then, as illustrated in FIG. 18, the LED chip 100 may be mounted on the second lead frame 300, and the first and second electrodes 150 and 160 of the LED chip 100 (see FIG. 7) may be wire-bonded to the surfaces of the first and second lead frames 200 and 300 using the wires 170 and 180, respectively. Subsequent processes may be performed in the same manner as in the manufacturing method according to the preceding exemplary embodiment.

Figure 19:
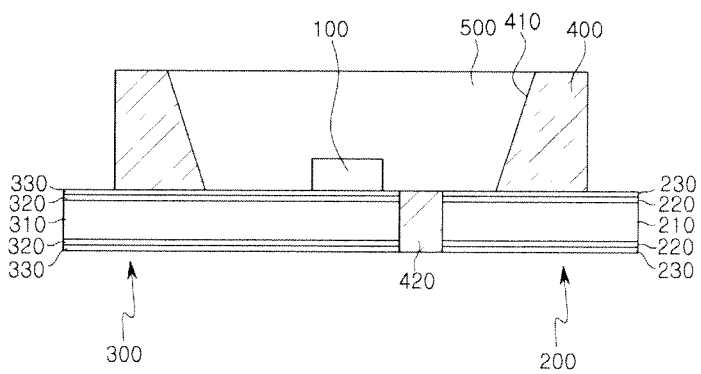
FIGS. 19 and 20 are views illustrating sequential processes in a method of manufacturing the LED package of FIG. 6.
Figure 20:
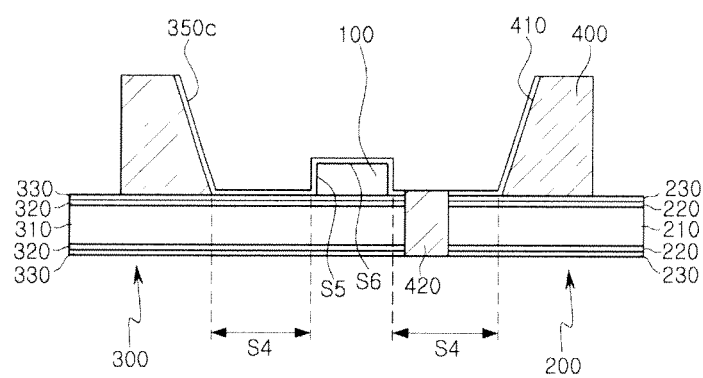

Hereinafter, a method of manufacturing the LED package 1000c illustrated in FIG. 6 will be described. FIGS. 19 and 20 are views illustrating sequential processes in a method of manufacturing the LED package 1000c of FIG. 6.

First of all, as illustrated in FIG. 16, the substrate B formed of a base material may be prepared, and the metal layers 220 and 320 and the first reflective layers 230 and 330 may be sequentially stacked on a surface of the substrate B.

Next, the substrate B formed of the base material may be patterned to form the patterned substrate B' (see FIG. 9)

Thereafter, the package body 400 may be formed, and the LED chip 100 may be mounted on the second lead frame 300, as illustrated in FIG. 19.

Then, the second reflective layer 350c may be formed to be extended to the inclined surface 410 and a portion S4 of the bottom surface of the package body 400, and the surface S5 and S6 of the LED chip 100.

Then, the first and second electrodes 150 and 160 of the LED chip 100 (see FIG. 7) may be wire-bonded to the surfaces of the first and second lead frames 200 and 300 using the wires 170 and 180, respectively. Subsequent processes may be performed in the same manner as in the manufacturing method according to the preceding exemplary embodiment.

Figure 23:
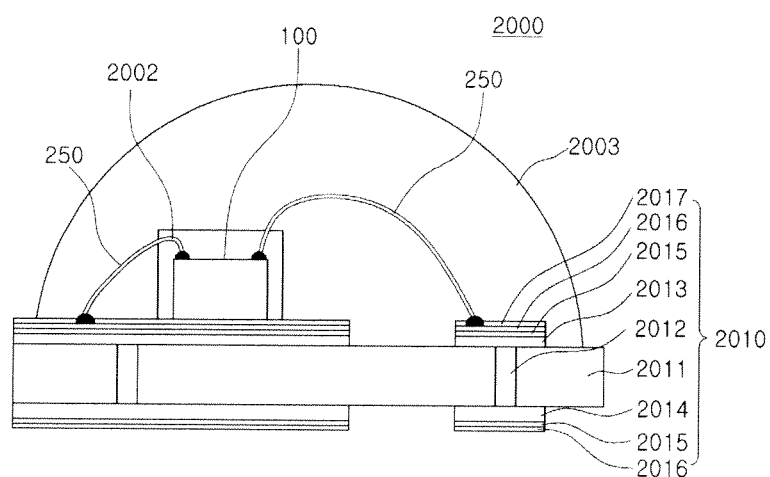
FIG. 23 is a cross-sectional view schematically illustrating an LED package according to another exemplary embodiment in the present disclosure.

FIG. 23 is a cross-sectional view schematically illustrating an LED package according to another exemplary embodiment in the present disclosure.

Referring to FIG. 23, an LED package 2000 may include the LED chip 100, a mounting board 2010 and a sealing body 2003. In addition, a wavelength conversion part 2002 may be formed on top and side surfaces of the LED chip 100. The LED chip 100 may be mounted on the mounting board 2010, and may be electrically connected to the mounting board 2010 through wires 250.

The mounting board 2010 may include a board body 2011, a top surface electrode 2013 and a bottom surface electrode 2014. A metal layer 2015, a first reflective layer 2016 and a second reflective layer 2017 may be formed on a surface of the top surface electrode 2013. In addition, the metal layer 2015 and the first reflective layer 2016 may be formed on a surface of the bottom surface electrode 2014.

Furthermore, the mounting board 2010 may include a through electrode 2012 connecting the top surface electrode 2013 to the bottom surface electrode 2014. The mounting board 2010 may be a printed circuit board (PCB), a metal core printed circuit board (MCPCB), a metal printed circuit board (MPCB) a flexible printed circuit board (FPCB), or the like, and the structure of the mounting board 2010 may be variously modified.

The wavelength conversion part 2002 may include a phosphor or a quantum dot. The sealing body 2003 may be formed to have a lens shape of which the top is convex. According to exemplary embodiments, the surface of the sealing body 2003 may be formed to have a convex or concave lens structure so that the angle of light emitted through the top surface of the sealing body 2003 may be adjusted.

The LED packages according to the exemplary embodiments in the present disclosure may be usefully applied to various products.

Figure 24:
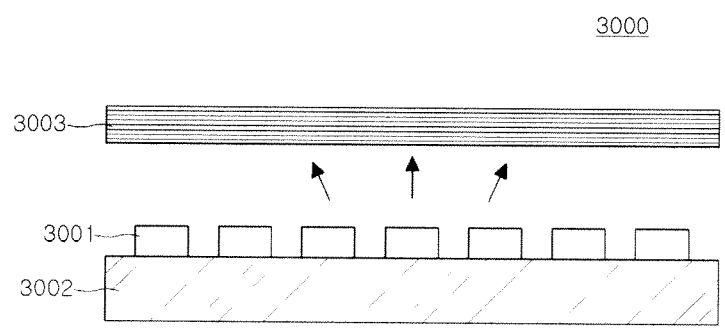
FIG. 24 is a cross-sectional view schematically illustrating an example of a backlight unit in which the LED package of FIG. 1 is employed.
Figure 25:
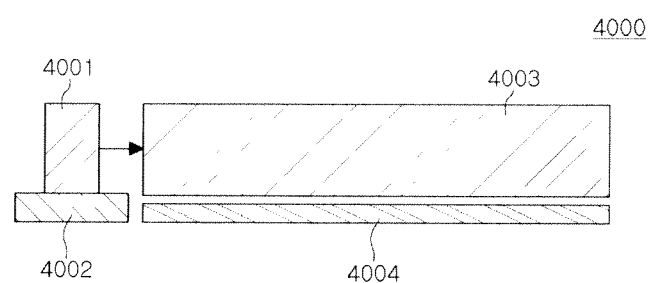
FIG. 25 is a cross-sectional view schematically illustrating another example of a backlight unit in which the LED package of FIG. 1 is employed.

FIGS. 24 and 25 illustrate examples of a backlight unit to which an LED package according to an exemplary embodiment in the present disclosure is applied.

With reference to FIG. 24, a backlight unit 3000 may include at least one light source 3001 mounted on a substrate 3002 and at least one optical sheet 3003 disposed thereabove. The light source 3001 may have the same structure as that of the aforementioned LED package 1000, 1000a, 1000b, 1000c or 2000, or a structure similar thereto.

The light source 3001 in the backlight unit 3000 of FIG. 24 emits light toward a liquid crystal display (LCD) device disposed thereabove, whereas a light source 4001 mounted on a substrate 4002 in a backlight unit 4000 according to another embodiment illustrated in FIG. 25 emits light laterally and the light is incident to a light guide plate 4003 such that the backlight unit 4000 may serve as a surface light source. The light source 4001 may have the same structure as that of the aforementioned LED package 1000, 1000a, 1000b, 1000c or 2000, or a structure similar thereto. The light travelling to the light guide plate 4003 may be emitted upwardly and a reflective layer 4004 may be formed below a bottom surface of the light guide plate 4003 in order to improve light extraction efficiency.

Figure 26:
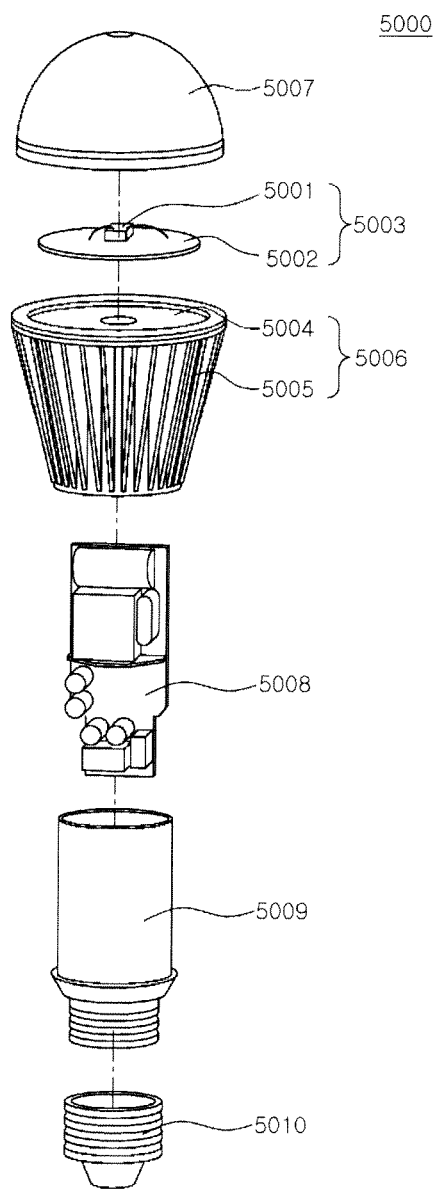
FIG. 26 illustrates an example of a lighting device to which an LED package according to an exemplary embodiment in the present disclosure is applied.

FIG. 26 is an exploded perspective view illustrating an example of a lighting device to which an LED package according to an exemplary embodiment in the present disclosure is applied.

A lighting device 5000 of FIG. 26 is exemplified as a bulb-type lamp, and may include a light emitting module 5003, a driver 5008 and an external connector 5010.

In addition, the lighting device 5000 may further include exterior structures such as external and internal housings 5006 and 5009, a cover 5007, and the like. The light emitting module 5003 may include a light source 5001 having the same structure as that of the aforementioned LED package 1000, 1000a, 1000b, 1000c or 2000, or a structure similar thereto, and a circuit board 5002 having the light source 5001 mounted thereon. For example, the first and second electrodes of the LED package may be electrically connected to an electrode pattern of the circuit board 5002. In the present exemplary embodiment, a single light source 5001 is mounted on the circuit board 5002 by way of example; however, a plurality of light sources may be mounted thereon as necessary.

The external housing 5006 may serve as a heat radiator and may include a heat sink plate 5004 directly contacting the light emitting module 5003 to thereby improve heat dissipation and heat radiating fins 5005 surrounding a lateral surface of the lighting device 5000. The cover 5007 may be disposed above the light emitting module 5003 and have a convex lens shape. The driver 5008 may be disposed inside the internal housing 5009 and be connected to the external connector 5010 such as a socket structure to receive power from an external power source. In addition, the driver 5008 may convert the received power into power appropriate for driving the light source 5001 of the light emitting module 5003 and supply the converted power thereto. For example, the driver 5008 may be provided as an AC-DC converter, a rectifying circuit part, or the like.

Figure 27:
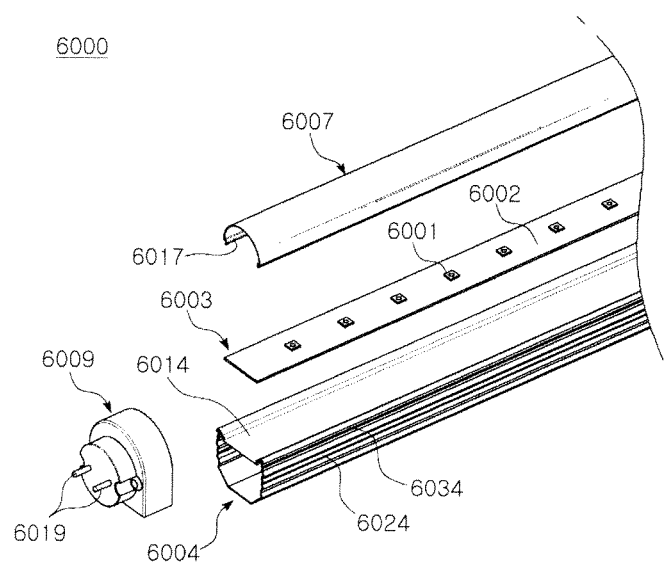
FIG. 27 illustrates another example of a lighting device to which an LED package according to an exemplary embodiment in the present disclosure is applied.

With reference to FIG. 27, a lighting device 6000 is exemplified as a bar-type lamp, and may include a light emitting module 6003, a body 6004, a cover 6007 and a terminal 6009.

The light emitting module 6003 may include a substrate 6002 and a plurality of light sources 6001 mounted on the substrate 6002. The light source 6001 may have the same structure as that of the aforementioned LED package 1000, 1000a, 1000b, 1000c or 2000, or a structure similar thereto.

The body 6004 may have a recess 6014 to which the light emitting module 6003 is fixed, and may dissipate heat generated in the light emitting module 6003 externally. Therefore, the body 6004 may include a heat sink as a support structure, and a plurality of heat radiating fins 6024 for dissipating heat may be protruded on both side surfaces of the body 6004.

The cover 6007 may be coupled to a groove 6034 of the body 6004, and may have a semispherical curved surface so as to uniformly irradiate light externally. A protrusion 6017 may be formed on a bottom surface of the cover 6007 in a length direction thereof so that the protrusion 6017 is engaged to the groove 6034.

The terminal 6009 may be disposed on at least one open end of the body 6004 in a length direction thereof to supply power to the light emitting module 6003, and may include an electrode pin 6019 protruded externally.

Figure 28:
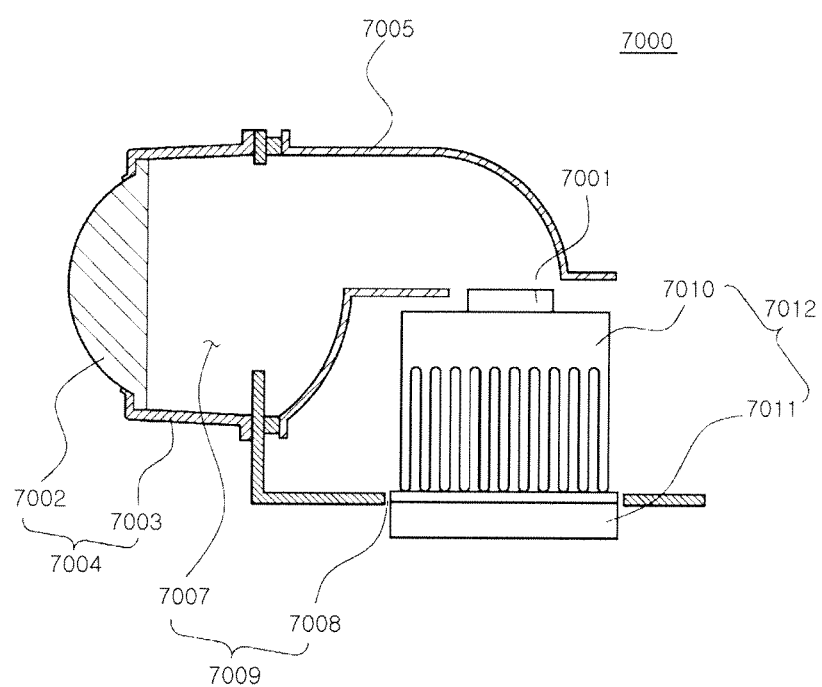
FIG. 28 illustrates an example of a headlamp to which an LED package according to an exemplary embodiment in the present disclosure is applied.

FIG. 28 illustrates an example of a headlamp to which an LED package according to an exemplary embodiment in the present disclosure is applied.

With reference to FIG. 28, a headlamp 7000 used in a vehicle or the like may include a light source 7001, a reflector 7005 and a lens cover 7004, and the lens cover 7004 may include a hollow guide part 7003 and a lens 7002. The light source 7001 may have the same structure as that of the aforementioned LED package 1000, 1000*a*, 1000*b*, 1000*c* or 2000, or a structure similar thereto.

The headlamp 7000 may further include a heat radiator 7012 externally dissipating heat generated by the light source 7001. The heat radiator 7012 may include a heat sink 7010 and a cooling fan 7011 in order to effectively dissipate heat. In addition, the headlamp 7000 may further include a housing 7009 allowing the heat radiator 7012 and the reflector 7005 to be fixed thereto and supported thereby. The housing 7009 may include a body 7006 and a central hole 7008 formed in one surface thereof, to which the heat radiator 7012 is coupled.

The housing 7009 may include a forwardly open hole 7007 formed in one surface thereof integrally connected to the other surface thereof and bent in a direction perpendicular thereto. The reflector 7005 may be fixed to the housing 7009, such that light generated in the light source 7001 may be reflected by the reflector 7005, pass through the forwardly open hole 7007, and be emitted outwards.

As set forth above, according to exemplary embodiments in the present disclosure, the discoloration of an LED package and a light device using the same may be avoided, whereby the amount of light provided thereby may be uniform. In addition, manufacturing time may be reduced, leading to a reduction in manufacturing costs.

While exemplary embodiments have been shown and described above, it will be apparent to those skilled in the art that modifications and variations could be made without departing from the scope in the present disclosure as defined by the appended claims.

What is claimed is:

1. A light emitting diode (LED) package, comprising:
 a package body provided with a pair of lead frames; and
 an LED chip mounted on the package body and electrically connected to the lead frames through wire bonding,
 wherein each lead frame includes:
 a first reflective layer disposed on a mounting surface on which the LED chip is disposed; and
 a second reflective layer disposed on the first reflective layer,
 a wire penetrates through the second reflective layer to be connected to the first reflective layer, and
 a thickness of the second reflective layer decreases in a direction towards the wire.

2. The LED package of claim 1, wherein the second reflective layer has an opening formed by the wire, and
 the wire contacts an inner sidewall of the opening.

3. The LED package of claim 1, wherein a region of the first reflective layer connected to the wire is recessed.

4. The LED package of claim 1, wherein the second reflective layer includes a first refractive layer and a second refractive layer.

5. The LED package of claim 4, wherein the first refractive layer is interposed between the second refractive, layer and the first reflective layer.

6. The LED package of claim 4, wherein the first refractive layer and the second refractive layer include a light transmissive material.

7. The LED package of claim 4, wherein the first refractive layer and the second refractive layer form a distributed Bragg reflector (DBR).

8. The LED package of claim 4, wherein the first reflective layer is formed of a material having a refractive index of 1.2 to 1.7.

9. The LED package of claim 4, wherein the second reflective layer is formed of a material having a refractive index of 2.0 or higher.

10. The LED package of claim 1, wherein the thickness of the second reflective layer decreases from a range of 20 nm to 100 nm to 0 in the direction towards the wire.

11. The LED package of claim 1, wherein the second reflective layer is disposed to cover the entirety of the first reflective layer except a portion of the first reflective layer which is in direct contact with the wire.

12. The LED package of claim 11, wherein the second reflective layer is extended to side surfaces of the lead frame.

13. The LED package of claim 1, wherein the second reflective layer is disposed to cover the LED chip.

14. The LED package of claim 13, wherein the second reflective layer includes a first refractive layer and a second refractive layer, and
 the second refractive layer and the first refractive layer are sequentially stacked on the LED chip.

15. The LED package of claim 1, wherein the second reflective layer has a light transmissivity of 90% or higher.

16. The LED package of claim 1, wherein the second reflective layer is disposed to cover the entirety of the lead frame except a portion of the lead frame on which the first reflective layer is in direct contact with the wire.

17. A light emitting diode (LED) package, comprising:
 a package body having a pair of lead frames and a concave portion through which the lead frames are exposed; and
 an LED chip mounted on the lead frames within the concave portion and electrically connected to the lead frames through wire bonding,
 wherein each lead frame includes:
 a first reflective layer disposed on a mounting surface on which the LED chip is disposed; and
 a second reflective layer disposed on the first reflective layer,
 a wire penetrates through the second reflective layer to be connected to the first reflective layer, and
 a thickness of the second reflective layer decreases in a direction towards the wire.

18. The LED package of claim 17, wherein the second reflective layer has an opening formed by the wire, and
 the wire contacts an inner sidewall of the opening.

19. The LED package of claim 17, wherein the second reflective layer is extended to a side surface of the concave portion.

20. A lighting device, comprising:
 a fixed structure; and
 the LED package of claim 1 coupled to the fixed structure and emitting light when power is supplied thereto through the fixed structure.

* * * * *